United States Patent
MacInnis et al.

(10) Patent No.: US 8,516,026 B2
(45) Date of Patent: Aug. 20, 2013

(54) SIMD SUPPORTING FILTERING IN A VIDEO DECODING SYSTEM

(75) Inventors: Alexander G. MacInnis, Los Altos, CA (US); Vivian Hsiun, Yorba Linda, CA (US)

(73) Assignee: Broadcom Corporation, Irvine, CA (US)

( * ) Notice: Subject to any disclaimer, the term of this patent is extended or adjusted under 35 U.S.C. 154(b) by 1550 days.

(21) Appl. No.: 10/786,195

(22) Filed: Feb. 25, 2004

(65) Prior Publication Data

US 2004/0181564 A1 Sep. 16, 2004

Related U.S. Application Data

(60) Provisional application No. 60/453,161, filed on Mar. 10, 2003.

(51) Int. Cl.
*G06F 17/10* (2006.01)
(52) U.S. Cl.
USPC ......................................................... 708/300
(58) Field of Classification Search
USPC ......................................................... 708/300
See application file for complete search history.

(56) References Cited

U.S. PATENT DOCUMENTS

| | | | | |
|---|---|---|---|---|
| 5,432,724 A | * | 7/1995 | Repko ............................. | 708/319 |
| 5,530,661 A | * | 6/1996 | Garbe et al. .................... | 708/420 |
| 5,659,780 A | * | 8/1997 | Wu .................................. | 712/19 |
| 5,668,749 A | * | 9/1997 | Corleto et al. ................. | 708/490 |
| 7,177,889 B2 | * | 2/2007 | Chatterjee ...................... | 708/300 |
| 7,424,501 B2 | * | 9/2008 | Macy, Jr. ........................ | 708/300 |
| 2004/0015528 A1 | * | 1/2004 | Langhammer et al. ........ | 708/300 |
| 2006/0212502 A1 | * | 9/2006 | Chatterjee ...................... | 708/300 |

* cited by examiner

*Primary Examiner* — David H Malzahn
(74) *Attorney, Agent, or Firm* — Thomas|Horstemeyer, LLP

(57) ABSTRACT

A filter engine that performs filtering operations on an input data stream comprising blocks of data. The filter engine includes a first memory element, a second memory element, a first shift register, a second shift register and a processor. The first and second memory elements store blocks of data to be processed. The first shift register receives and stores blocks of data from the first memory element. The second shift register receives and stores blocks of data from the second memory element. The first and second shift registers are adapted to selectively shift their contents by a predetermined number of bits corresponding to the size of a data element, such as a pixel. The processor receives blocks of data from the first and second shift registers and simultaneously performs filtering operations on blocks of data from the first and second shift registers.

22 Claims, 10 Drawing Sheets

| clk 1 | clk 2 | clk 3 | clk 4 | clk 5 | clk 6 | clk 7 | clk 8 | clk 9 | clk 10 | clk 11 | clk 12 | clk 13 | clk 14 | clk 15 |
|---|---|---|---|---|---|---|---|---|---|---|---|---|---|---|
| LDZS | LDZS | LDZS | LDZS | LDZS | | | | | | | | | | |
| | LDZS | LDZS | LDZS | LDZS | LDZS | | | | | | | | | |
| | | Loop2 | Loop2 | Loop2 | Loop2 | Loop2 | | | | | | | | |
| | | | Macs | Macs | Macs | Macs | Macs | | | | | | | |
| | | | | Loop1 | Loop1 | Loop1 | Loop1 | Loop1 | | | | | | |
| | | | | | LDZS | LDZS | LDZS | LDZS | LDZS | | | | | |
| | | | | | | Macs | Macs | Macs | Macs | Macs | | | | |
| | | | | | | | | LDZS | LDZS | LDZS | LDZS | LDZS | | |
| | | | | | | | | | Macs | Macs | Macs | Macs | Macs | |

| clk 12 | clk 13 | clk 14 | clk 15 | clk 16 | clk 17 | clk 18 | clk 19 | clk 20 | clk 21 | clk 22 | clk 23 | clk 24 | clk 25 | clk 26 |
|---|---|---|---|---|---|---|---|---|---|---|---|---|---|---|
| MA | MA | MA | MA | MA | | | | | | | | | | |
| | LDZS | LDZS | LDZS | LDZS | LDZS | | | | | | | | | |
| | | | | | | | | | | | | | | |
| ST | ST | ST | ST | ST | ST | ST | | | | | | | | |
| | | | | Macs | Macs | Macs | Macs | Macs | | | | | | |
| | | | | | | Loop1 | Loop1 | Loop1 | | | | | | |
| | | | | | | | | LDZS | LDZS | LDZS | LDZS | LDZS | | |
| | | | | | | | | Macs | Macs | Macs | Macs | Macs | | |
| | | | | | | | | | | LDZS | LDZS | LDZS | LDZS | LDZS |
| | | | | | | | | | | | Macs | Macs | Macs | Macs |

| clk 23 | clk 24 | clk 25 | clk 26 | clk 27 | clk 28 | clk 29 | clk 30 | clk 31 | clk 32 | | | | | |
|---|---|---|---|---|---|---|---|---|---|---|---|---|---|---|
| Macs | Macs | Macs | Macs | Macs | | | | | | | | | | |
| | MA | MA | MA | MA | MA | MA | | | | | | | | |
| LDZS | LDZS | LDZS | LDZS | LDZS | LDZS | | | | | | | | | |
| | | | | ST | ST | ST | ST | | | | | | | |
| | | | | EOF | EOF | EOF | EOF | EOF | | | | | | |
| | | | | | | MA | MA | MA | MA | | | | | |
| | | | | | | INST | INST | INST | INST | | | | | | note: If the 1st cmd in the queue is "update A0 with 'wait' option", the "update A0" command overwrites the previous MA's result.

INST=(PC=0), if there is no executable function available in the queue;
INST= the 1st inst of next executable function, if there is executable function available in the queue.

FIG. 10

SIMD SUPPORTING FILTERING IN A VIDEO DECODING SYSTEM

PRIORITY CLAIM TO RELATED APPLICATIONS

This application claims priority to U.S. Provisional Patent Application Ser. No. 60/453,161, entitled "SIMD SUPPORTING FILTERING IN A VIDEO DECODING SYSTEM," filed on Mar. 10, 2003, the subject matter of which is hereby specifically incorporated herein by reference.

INCORPORATION BY REFERENCE OF RELATED APPLICATIONS

The following U.S. patent applications are related to the present application and are hereby specifically incorporated by reference: patent application Ser. No. 10/114,798, entitled "VIDEO DECODING SYSTEM SUPPORTING MULTIPLE STANDARDS"; patent application Ser. No. 10/114,679, now U.S. Pat. No. 7,034,897, entitled "METHOD OF OPERATING A VIDEO DECODING SYSTEM"; patent application Ser. No. 10/114,797, now U.S. Pat. No. 6,963,613, entitled "METHOD OF COMMUNICATING BETWEEN MODULES IN A DECODING SYSTEM"; patent application Ser. No. 10/114,886, now U.S. Pat. No. 7,007,031, entitled "MEMORY SYSTEM FOR VIDEO DECODING SYSTEM"; patent application Ser. No. 10/114,619, now U.S. Pat. No. 7,096,245, entitled "INVERSE DISCRETE COSINE TRANSFORM SUPPORTING MULTIPLE DECODING PROCESSES"; and patent application Ser. No. 10/113,094, entitled "RISC PROCESSOR SUPPORTING ONE OR MORE UNINTERRUPTIBLE CO-PROCESSORS"; all filed on Apr. 1, 2002; patent application Ser. No. 10/293,663, now U.S. Pat. No. 6,771,196, entitled "PROGRAMMABLE VARIABLE-LENGTH DECODER", filed on Nov. 12, 2002; and patent application Ser. No. 10/404,074, entitled "MEMORY ACCESS ENGINE HAVING MULTI-LEVEL COMMAND STRUCTURE"; patent application Ser. No. 10/404,389, entitled "INVERSE QUANTIZER SUPPORTING MULTIPLE DECODING PROCESSES"; and patent application Ser. No. 10/404,387, entitled "VIDEO DECODING SYSTEM HAVING A PROGRAMMABLE VARIABLE-LENGTH DECODER", all filed on Apr. 1, 2003.

FIELD OF THE INVENTION

The present invention relates generally to a filter engine for performing filtering operations on data elements that represent video information, and more particularly to a SIMD processor for performing such filtering operations.

BACKGROUND OF THE INVENTION

Video images frequently are compressed in order to reduce the bandwidth required for transmission. The compression typically is performed by one of several compression algorithms, such as MPEG-1, MPEG-2, MPEG-4, MPEG-4 AVC, H.263, H.263+, H.264, and proprietary algorithms. Such algorithms can result in blocks of data with low bit rates. However, when the blocks are decoded or decompressed, they are likely to result in objectionable artifacts that manifest themselves as blockiness, high frequency noise and ringing along edges of objects and banding in smoothly varying areas of an image. Each compression algorithm may include some form of filtering, including loop filtering or post filtering. At the present time, the filtering is implemented purely in software or firmware or as dedicated hardware for each algorithm. There is a need for hardware that can be internally configured to execute a variety of dynamic filtering algorithms. It is desirable that the filtering operations are performed at a high data throughput rate. It is desirable that the hardware that can perform the filtering algorithms be of low cost.

Further limitations and disadvantages of conventional and traditional approaches will become apparent to one of skill in the art, through comparison of such systems with the present invention as set forth in the remainder of the present application with reference to the drawings.

SUMMARY OF THE INVENTION

The present invention provides a filter engine that performs filtering operations on an input data stream comprising blocks of data. The filter engine includes a first memory element, a second memory element and a single-instruction, multiple-data (SIMD) processor. The first and second memory elements store blocks of data to be processed. The SIMD processor receives blocks of data from the first and second memory elements and simultaneously performs filtering operations on blocks of data from the first and second memory elements.

Another aspect of the present invention provides a filter engine that performs filtering operations on an input data stream comprising blocks of data. The filter engine includes a first memory element, a second memory element, a first shift register, a second shift register and a processor. The first and second memory elements store blocks of data to be processed. The first shift register receives and stores blocks of data from the first memory element. The second shift register receives and stores blocks of data from the second memory element. The first and second shift registers are adapted to selectively shift their contents by a predetermined number of bits corresponding to the size of a data element, such as a pixel. The processor receives blocks of data from the first and second shift registers and simultaneously performs filtering operations on blocks of data from the first and second shift registers.

It is understood that other embodiments of the present invention will become readily apparent to those skilled in the art from the following detailed description, wherein shown and described are only example embodiments of the invention by way of illustration. As will be realized, the invention is capable of other and different embodiments, and its several details are capable of modification in various other respects, all without departing from the spirit and scope of the present invention. Accordingly, the drawings and detailed description are to be regarded as illustrative in nature and not as restrictive.

BRIEF DESCRIPTION OF THE DRAWINGS

Certain aspects and advantages of the present invention will be apparent upon reference to the accompanying description when taken in conjunction with the following drawings, which are exemplary, wherein:

FIG. 10 is a timing diagram showing the timing of the execution of the illustrative assembler code of FIG. 9.

DESCRIPTION OF THE PREFERRED EMBODIMENTS

Figure 1:
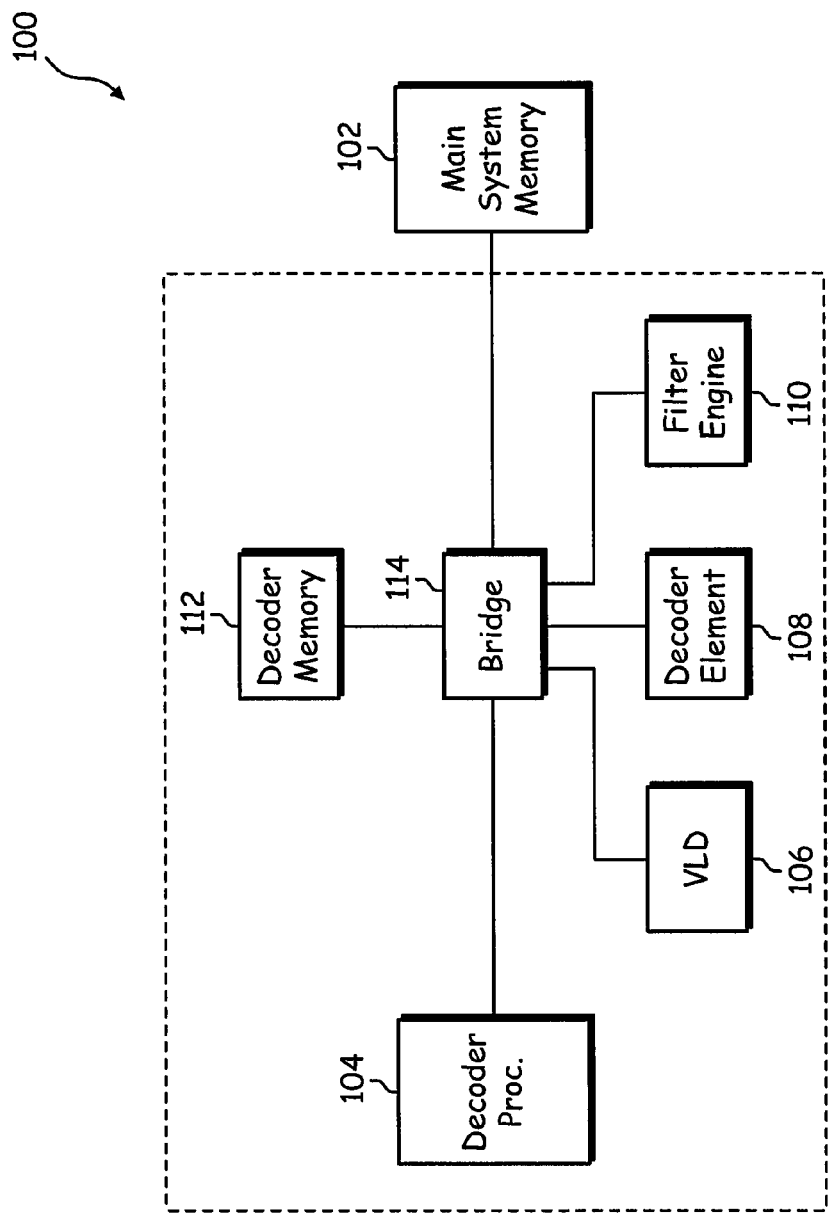
FIG. 1 is a functional block diagram of a decoding system according to an illustrative embodiment of the present invention.

FIG. 1 is a functional block diagram of a decoding system 100, according to an illustrative embodiment of the present invention. Decoding system 100 is illustratively part of a larger system, for which main memory unit 102 serves as the main system memory. Decoding system 100 includes decoder processor 104, variable-length decoder (VLD) 106, decoder element 108, filter engine 110, decoder memory 112, and bridge module 114. Decoder system 100 can have any number of decoder elements in addition to decoder element 108. The decoder elements, such as decoder elements 108, can provide any of a multitude of decoding functions, such as inverse quantization and transform operations, and such as inverse discrete cosine transform (IDCT) operations, for example. Decoder processor 104 performs decoding functions and controls, coordinates and monitors other decoding modules, such as VLD 106, decoder elements 108 and filter 110. VLD 106 accelerates the process of decoding variable-length codes in an incoming data stream, which might otherwise be a bottleneck for a decoding process if it were handled by the core processor 104 alone. Decoder memory 112 is used to store data that is being decoded during various stages of the decoding process. Bridge module 114 provides an interface between system memory 102 and decoder memory 112, as well as between the various modules within the decoding system 100.

In order to accommodate the large number of algorithms and future changes in them, several processing functions are merged into a single processing unit, namely, the filter engine processor 110. The filter engine 110 illustratively comprises two main internal units: a Reduced Instruction Set Computer (RISC) processor and a single-instruction, multiple-data (SIMD) processor. In an illustrative embodiment of the present invention, the filter engine 110 has its own internal memory used to minimize internal system traffic. Depending on the performance requirements of the system which decoding system 100 is to service, it is possible to have multiple instances of the filter engine module 110 to accommodate particular product requirements.

In an illustrative embodiment of the present invention, the decoding system 100 is a video decoding system. In such an embodiment, the filter engine 110 performs operations such as pixel filtering & motion compensation (PF/MC), in-loop deblocking, and post-processing (deblocking, etc.). Although aspects of the present invention are applicable to a wide range of decoding systems, for purposes of explanation, aspects of the present invention will be described herein with respect to a video decoding system.

In an illustrative embodiment of the present invention, the filter engine 110 is designed to perform pixel filtering, motion compensation and de-blocking of, for example, MPEG1, MPEG2, MPEG4, MPEG-4 AVC, and H264 video standards. Filter engine operation is based on downloadable macro-codes, thus providing a high level of flexibility and ability to support other standards or even create customized solutions per specific applications.

As previously mentioned, in an illustrative embodiment of the present invention, the filter engine 110 performs pixel filtering and interpolation as part of the motion compensation process. Motion compensation uses a small piece of an image from a previous picture to predict a piece of the current image; typically the reference image segment is in a different location within the reference picture. Rather than recreate the current image segment anew from scratch, the previous image is used and the appropriate region of the image moved to the proper location within the current picture; this may represent the image segment accurately, or more generally there may still be a need for coding the residual difference between this prediction and the actual current image segment. The new location is indicated by motion vectors that denote the spatial displacement in the picture with respect to the reference picture.

The filter engine 110 performs the interpolation necessary when a reference block is translated (motion-compensated) by a vector that cannot be represented by an integer number of whole-pixel locations. For example, a hypothetical motion vector may indicate to move a particular block 10.5 pixels to the right and 20.25 pixels down for the motion-compensated prediction. In an illustrative embodiment of the present invention, the motion vectors are decoded by the VLD 106 in a previous processing pipeline stage and are further processed in the core processor 104 before being passed to the pixel filter, typically via the decoder memory 112. Thus, the filter engine 110 gets the motion information as vectors and not just bits from the bitstream. In an illustrative embodiment, the reference block data that is used by the motion compensation process is read by the filter engine 110 from the decoder memory 112, the required data having been moved to decoder memory 112 from system memory 102; alternatively the pixel filter obtains the reference block data from system memory 102. Typically the filter engine 110 obtains the processed motion vectors from decoder memory 112. The filter engine 110 reconstructs the macroblock being decoded by performing the addition of the decoded difference (or residual or "error") pixel information to the pixel prediction data. The pixel data that results from motion compensation of a given macroblock is stored in memory after decoding of said macroblock is complete. In an illustrative embodiment, the decoded macroblock data is written to decoder memory 102 and then transferred to system memory 110; alternatively, the decoded macroblock data may be written directly to system memory 102. If and when that decoded macroblock data is needed for additional motion compensation of another macroblock, the filter engine 110 retrieves the reference macroblock pixel information from memory, as above, and again the reconstructed macroblock pixel information is written to memory, as above.

In an illustrative embodiment, the filter engine 110 supports a variety of filter algorithms, including ½ pixel and ¼ pixel interpolations in either or both of the horizontal and vertical axes; each of these can have many various definitions, and the pixel filter can be configured or programmed to support a wide variety of filters, thereby supporting a wide range of video formats, including proprietary formats. The filter engine module 110 is illustratively programmable to support a wide variety of block sizes, including 16×16, 16×8, 8×16, 8×8, 8×4, 4×8 and 4×4, and other sizes if needed. The filter engine 110 illustratively is also programmable to support different interpolation algorithms with different numbers of filter taps, such as 2, 4, or 6 taps per filter, per dimension. In an illustrative embodiment, the filter engine 110 is also programmable to support different transform block types, such as field-type and frame-type transform blocks. The filter engine 110 is further programmable to support different matrix formats. Furthermore, the filter engine 110 supports all the intra and inter prediction modes in the H.264/MPEG-4 AVC draft standard.

The filter module 110 is also capable of performing the de-blocking operations common in many low bit-rate coding standards. Some decoding algorithms employ a loop filter and others employ a post filter. Therefore, the filter engine 110 is programmable to perform de-blocking either within the decoding loop or outside the decoding loop. The filter engine is also capable of performing de-ringing operations both within the decoding loop and outside the decoding loop. The filter engine 110 has programmable coefficients and thresholds for performing a variety of de-blocking algorithms in either the horizontal or vertical directions. In an illustrative embodiment of the present invention, the coefficients, thresholds and other parameters employed by the filter engine are programmed by the core processor 104 according to the de-blocking technique employed with the encoding/decoding format of the data stream being decoded.

Figure 2:
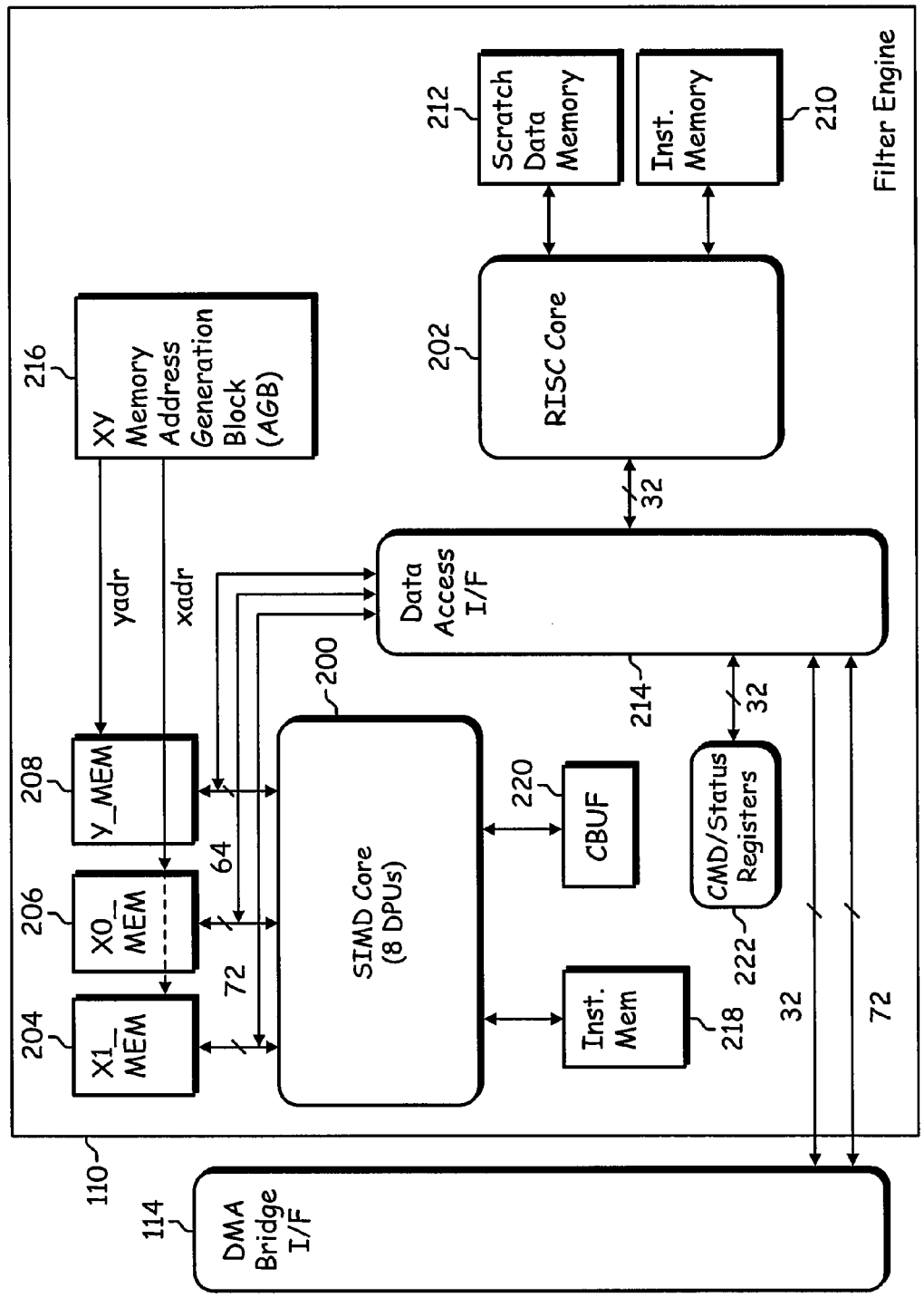
FIG. 2 is a functional block diagram representing a filter engine according to an illustrative embodiment of the present invention.

FIG. 2 is a functional block diagram representing a filter engine 110 according to an illustrative embodiment of the present invention. The filter engine 110 includes a SIMD processor 200 and a RISC processor 202. The RISC processor 202 controls the operations of the filter engine 110. The RISC processor 202 controls the data flow and schedules tasks. It also takes care of some decision-making functions. The SIMD processor 200 performs internal SIMD instructions to process data in parallel with the RISC control processor 202. The SIMD engine 200 is architected to be very efficient as a coprocessor to the RISC processor 202, performing specialized filtering and decision-making tasks. In an illustrative embodiment, the SIMD processor 200 is an 8-way SIMD processor. The RISC processor 202 is illustratively a 32-bit RISC processor and is illustratively a MIPS processor. Both processors illustratively operate at the same clock frequency.

The SIMD processor 202 includes a split X-memory comprising memory element X1 204 and X0 206, which allow for simultaneous operations. The SIMD processor 202 also illustratively includes a Y-memory 208, a Z-register input with byte shift capability (not shown), 16-bit-per-element inputs, and no branch or jump functions. The SIMD processor 200 has hardware for three-level looping, and it has a hardware function call and return mechanism for use as a coprocessor. All of these help to improve performance and minimize the area.

In general, processing in the filter engine 110 is done on a macroblock basis under the control of the main core processor 104. Once the filter engine has been initialized, it stays in the "ready" state, waiting for "FE_bgn" (Filter Engine Begin) to occur. The core decoder processor 104 will not issue the "FE_bgn" until the macroblock header, parameter information and data are ready in the main system memory 102 or decoder memory 112 for processing by the filter engine 110. Operation of the filter engine 110 is based on the information derived from the prediction and de-blocking buffers resulting from the normal decoding process. When the filter engine 110 completes its assigned tasks, it sets "FE_done" and then goes back to the "ready" state to begin again the cycle described above. The core processor 104 can program operational parameters into the filter engine 110 at any time.

The RISC processor 202 is illustratively a 32-bit RISC processor. It has an instruction cache 210 (illustratively 1 k word (4-kbyte)) and a data cache memory 212 (illustratively 4 kByte). The RISC processor 202 controls the operations of the filter engine 110. Its functions include the control of the data flow and scheduling tasks. It also performs part of the deblocking functions and address generation for reference prediction reads or reconstruction writes. The RISC processor 202 is able to access all memories and registers in the filter engine 110, all data in the decoder memory 112 and all data in the main system memory 102.

Data access unit 214 manages the data flow in and out of the filter engine 110. A data bus (illustratively 128 bits) communicates between the data access unit 214 and the RISC processor 202. The bus illustratively runs at half the core speed. The data access unit 214 decodes the (illustratively 32-bit) address to determine whether the request is for internal memory (X memory 204, 206, Y memory 208, or an internal register) or external memory (decoder memory 112 or main system memory 102). If it is an external memory request, the data access unit 214 generates a request to the DMA bridge 114. The data access unit also performs processing on data before forwarding it to its destination.

In an illustrative embodiment of the present invention, the SIMD processor 200 has a 5-stage instruction pipeline structure. The five stages are instruction fetching, instruction decoding, operand fetching, execution 1 and execution 2. The SIMD processor 200 executes macrocodes (sets of SIMD instructions strung together to perform a function) that are loaded by the RISC processor 202 into the instruction memory 218. The RISC processor 202 orders the execution of these macrocodes in the instruction memory 218 through the command queue 220. This provides a high level of flexibility and ability to support multiple standards or even create customized solutions per specific applications.

The SIMD processor 200 illustratively has a 28-bit instruction set. Every instruction takes one cycle. The SIMD processor 200 supports conventional SIMD instructions, in addition to some special instructions. There are no "branch," "jump," "call" or "return" instructions. The SIMD processor 200 has a hardware function call and return mechanism, which allows the SIMD 200 to be used as a coprocessor to the RISC processor 202. The hardware "Do" loop executes with no overhead cycles. The SIMD processor 200 is a slave of the RISC processor 202. The SIMD processor 200 performs functions specified in the command queue 220 written by the RISC processor 202. SIMD 200 will keep executing function calls as long as there is an executable function available in the command queue 220.

At the end of each function, there is an end-of-function (EOF) instruction. When the SIMD processor 200 executes an EOF instruction, if there is no executable function currently pending in the queue 220, it sets a next program counter (nxt_pc) to "0", and SIMD 200 back to idle state (Program counter=0), where it waits for the next function call. If there is an executing function currently pending in the command queue 220, control jumps immediately to the indicated next function.

The SIMD processor 200 uses three main memory elements, X1 204, X0 206 and Y 208, which are illustratively SRAM memory elements. In an illustrative embodiment, memory elements X1 204 and X0 206 are 4-kB each (256× 128) and memory element Y is a 1.28 kB (80×128) memory. The SIMD processor 200 includes an XY memory address generation block 216, which generates the read/write addresses of the X1, X0 and Y memory elements for accessing the operands and storing back the results. The SIMD processor 200 illustratively includes no general purpose registers, but rather works out of the memory elements X1, X0 and Y.

In an illustrative embodiment of the present invention, the SIMD processor 200 is designed to include pixel alignment functionality to enable MPEG-HD performance, in the event such functionality is unavailable from the DMA/bridge module 114. But in the preferred embodiment, the DMA bridge 114 includes such functionality and aligns the data before it reaches the SIMD processor 200.

In an illustrative embodiment, the filter engine also includes command and status registers, represented in FIG. 2 by block 222.

Figure 3:
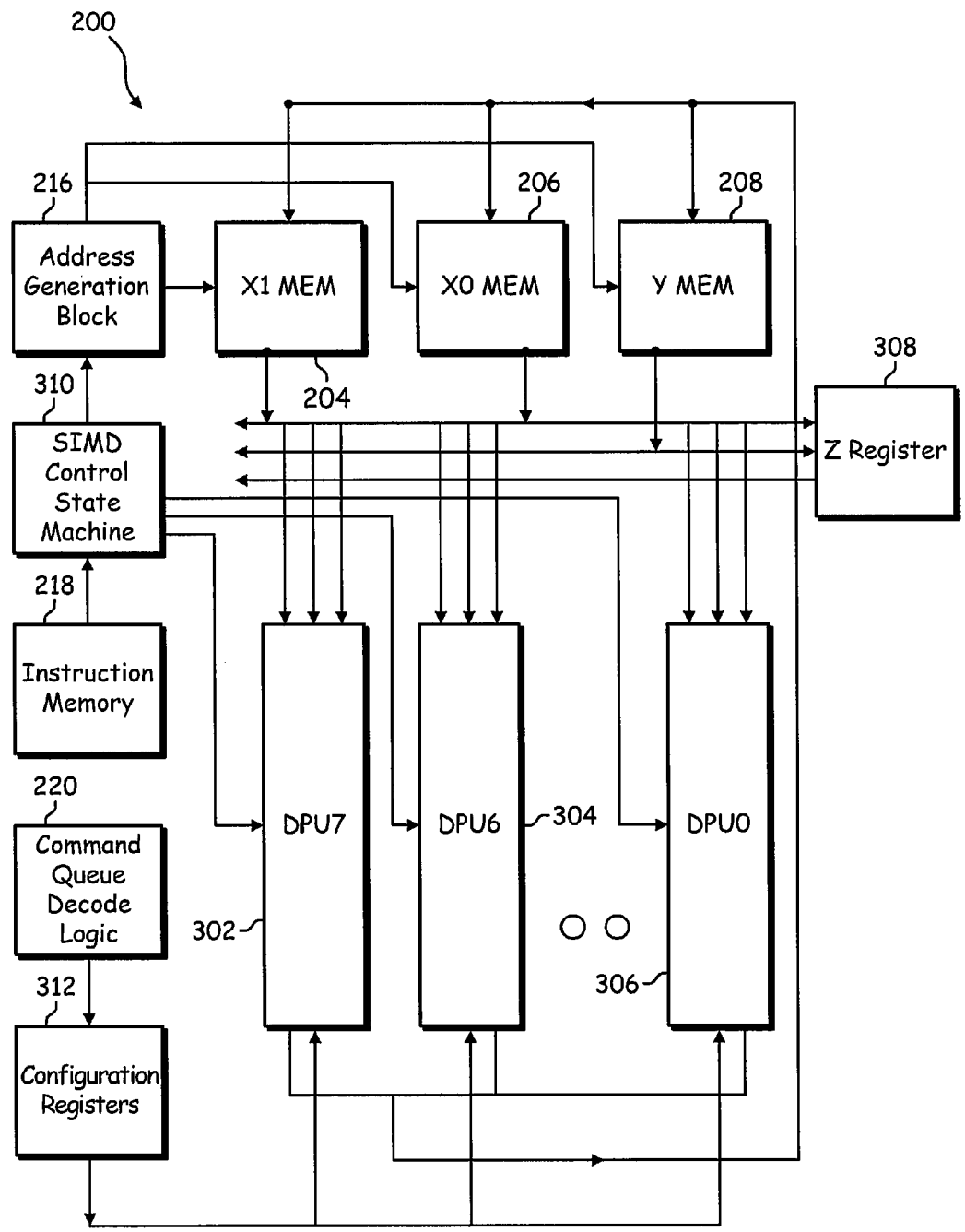
FIG. 3 is a functional block diagram representing the SIMD processor according to an illustrative embodiment of the present invention.

FIG. 3 is a functional block diagram representing the SIMD processor 200 according to an illustrative embodiment of the present invention. The SIMD processor 200 has a data path that comprises eight identical data path units (DPU0-DPU7) capable of performing basic arithmetic operations. In FIG. 3, three of these data path units, DPU7 302, DPU6 304 and DPU0 are shown. The data to be processed is stored in memories X1 204 and X0 206 and Y memory 208. Z register 308 is used for pixel-shift capability. The addressing of the X memory 204, 206 and Y memory 208 is controlled by the SIMD control state machine 310 through the address generation block 216. Configuration registers 312 contain parameters which are programmed by RISC processor 202 through the command queue 220. These parameters dictate the way in which the DPUs process the data. The RISC processor 202 controls the SIMD processor 200 through the command queue 220.

Figure 4:
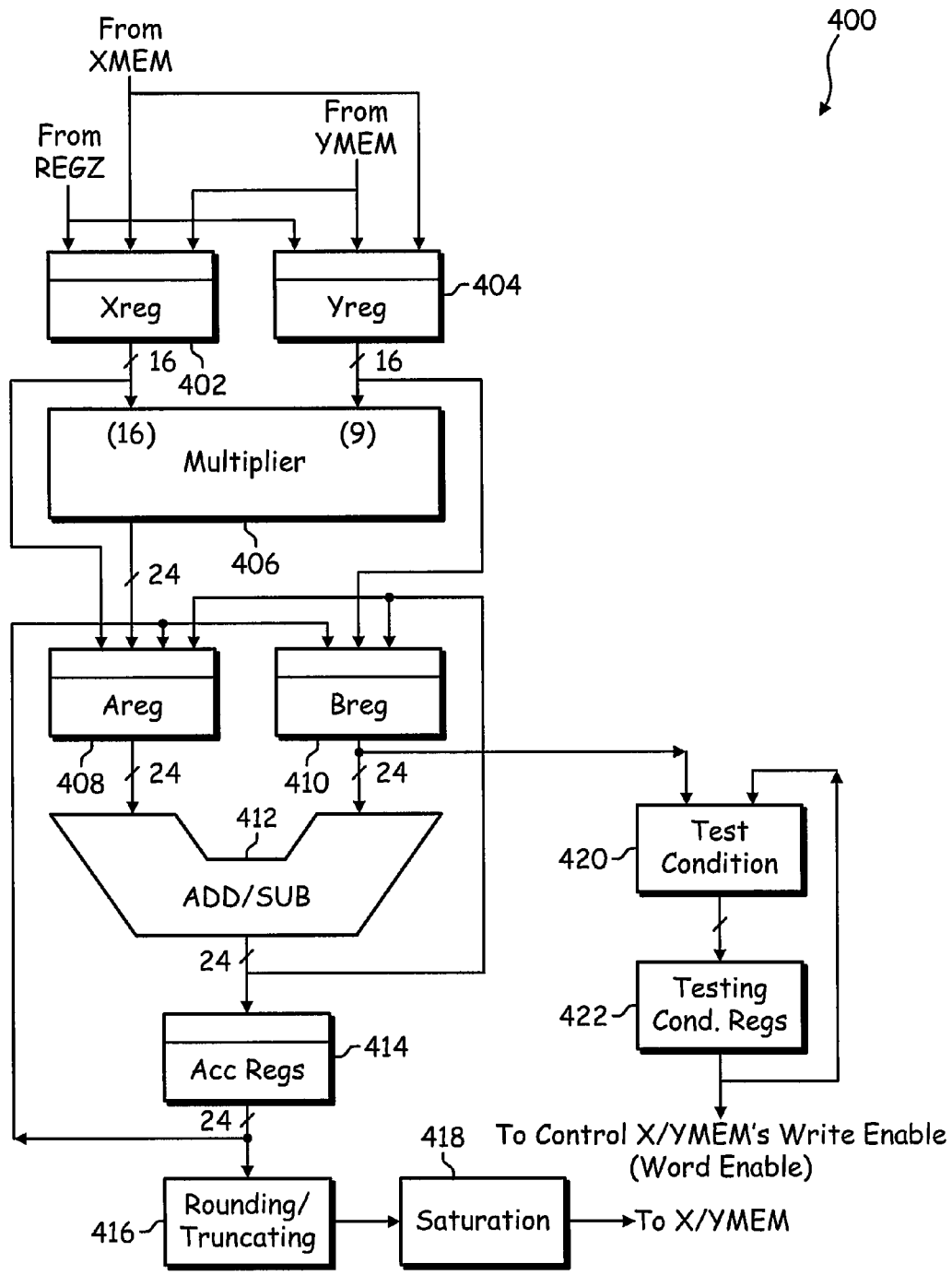
FIG. 4 is a functional block diagram representing the data path of a single data path unit according to an illustrative embodiment of the present invention.

FIG. 4 is a functional block diagram representing the data path 400 of a single data path unit, i.e., one of the eight data path units DPU0-DPU7, in accordance with one embodiment of the present invention. The X input register 402 and Y input register 404 receive the data to be processed from the X0 and X1 memory elements, the Y memory element and the Z register. The data path further includes a multiplier 406 (illustratively 16×9) and intermediate registers A 408 and B 410. Adder 412 (illustratively 24-bit) has maximum, minimum, subtraction and absolute value functionality. Accumulator 414 illustratively comprises four 24-bit accumulate registers. The data path further comprises rounding and truncating block 416 and saturation block 418. The output of the saturation block 418 is stored in X or Y memory. The data path further comprises test condition block 420 and test condition registers 422, which illustratively comprise sixteen 1-bit condition registers. The values held in the test condition registers 422 are used to control the write enable pins of the X0, X1 and Y memory elements.

The data path 400 receives controls from the SIMD control state machine 310 and performs the necessary operations as required for the execution of a specific instruction. In an illustrative embodiment, each data path unit 400 receives two 16-bit operands. Each of these two can be from either X memory 204, 206, Y memory 208 or Z register 308. These operands are registered in the X register 402 and Y register 404. In an illustrative embodiment, there is no stall in the SIMD pipeline and therefore these two registers 402, 404 are free running.

Multiplier 406 is illustratively a two-stage pipelined multiplier. The multiplier 406 receives a 16-bit input from the X register 402 and a 9-bit input from the Y register 404. A register 408 and B register 410 are illustratively 24-bit registers. The A register 408 receives sign extended (24-bits) data from either the X register 402 or the multiplier 406 or from one of the four accumulators 414. The B register 410 receives sign extended (24-bits) data from either the Y register 404 or from one of the four the accumulators 414. In the case of data dependency in the previous instruction, both A register 408 and B register 410 get data directly from the result of the previous instruction. A register 408 and B register 410 are illustratively free-running registers.

The output of the A and B registers 408, 410 form the two inputs to the 24-bit adder 412. The adder output is registered into any one of the accumulator registers 414. Each accumulator register is controlled by a separate strobe that dictates which accumulator register gets updated at the end of the add operation.

Referring again to FIGS. 2 and 3, Y memory 208 is illustratively a single-port memory. In an illustrative embodiment of the present invention, during SIMD operations, the Y memory 208 is read and written only by the SIMD processor 200. The Y memory is also memory-mapped on the RISC processor 200. But, in an illustrative embodiment, the RISC processor 202 can only access Y memory 208 when the SIMD processor 200 is in an idle state. After the SIMD processor 200 completes an operation, then Y memory 208 can be accessed by the RISC processor 202. The Y memory serves as a working memory. The Y memory 208 is a local memory. It can only be accessed by the SIMD processor 200 or the RISC processor 202.

The X memory 204, 206 is a dual-port memory formed using two dual-port memories X1 204 and X0 206. On both the X1 memory 204 and X0 memory 206, one of the two ports is used by the SIMD processor 200 and the other port is used for transferring data between the SIMD processor 200 and the DMA bridge module 114. Thus the new data can be brought in to the X memory at the same time that the SIMD processor 200 is processing existing data in the X memory. As part of SIMD operations, the X memory 204, 206 memory is read and written only by the SIMD processor 200. The X memory 204, 206 is also memory-mapped on the RISC processor 200. But illustratively the RISC processor 202 can only access X memory 204, 206 when the SIMD processor 200 is in an idle state. After the SIMD processor 200 completes an operation, then X memory 204, 206 can be accessed by the RISC processor 202. The X memory 204, 206 is a local memory. It can only be accessed by the SIMD processor 200 or the RISC processor 202.

In the case of MPEG-4 AVC/H264, the smallest block size on which pixel filter and motion compensation operations are performed is 4×4. In order to fully utilize 8 DPUs in the SIMD processor 200 during such filtering, a split mode of X memory 204, 206 is provided wherein X1 204 and X0 206 function as separate memory elements. In the non-split mode the X0 memory 204 and X1 memory 206 form a single memory of double the depth. But while in split mode they operate as two separate memories with separate data output buses. The mode of operation is defined in the instruction opcode. The performance of the SIMD processor with the split mode is almost double what it would be without it when processing 4×4 blocks.

The operation of the data path units 302, 304, 306 remains the same whether the SIMD 200 is operating in split mode or non-split mode. Illustratively only the front end (data read from X memory 204, 206 or its related data) of the SIMD processor 200, and not the data path units 302, 304, 306, operate differently according to whether the SIMD is operating in split mode or non-split mode. In the normal case (non-split mode), X1 memory 204 and X0 memory 206 function as a single memory. Only one of them is accessed by any one SIMD instruction. In the split case, X1 memory 204 and X0 memory 206 operate simultaneously. One SIMD instruction can access both of them.

Figure 5:
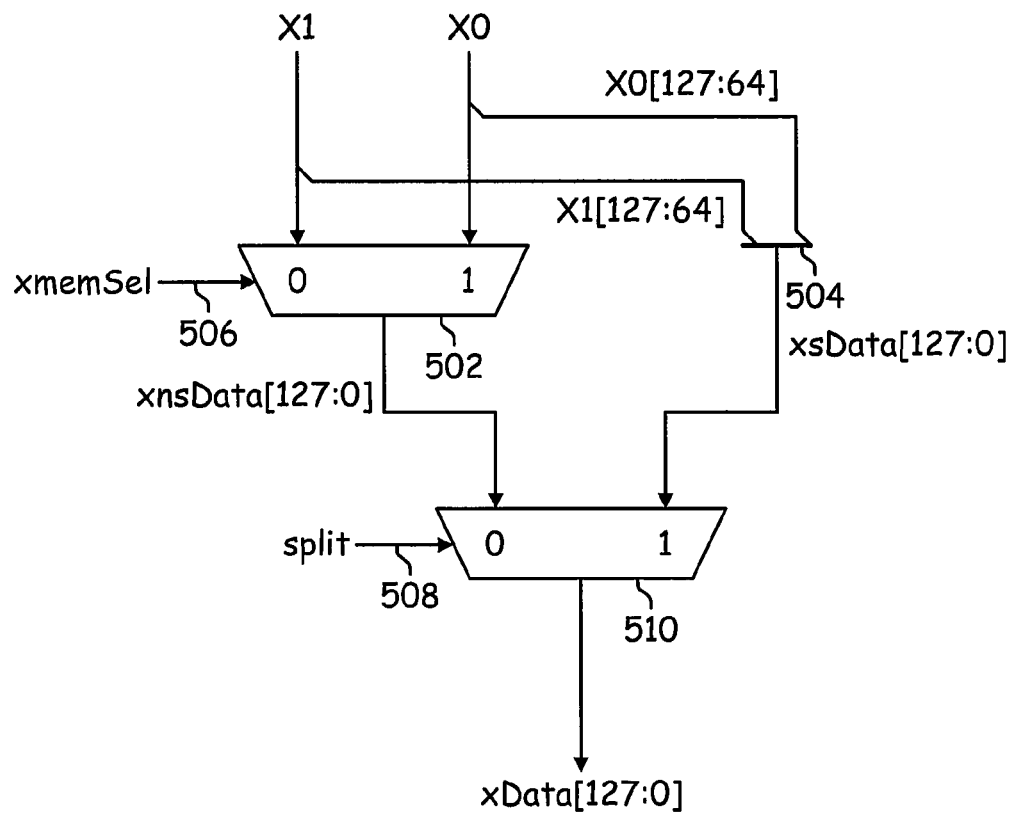
FIG. 5 is a schematic diagram demonstrating the process of selecting whether the X memory is used in the split or non-split mode according to an illustrative embodiment of the present invention.

FIG. 5 is a schematic diagram demonstrating a process of selecting whether the X memory is used in the split or non-split mode, in accordance with one embodiment of the present invention. In the illustrative embodiment of FIG. 5, the contents of memory X1 204 and memory X0 206, each comprising 128 bits, are both provided to the inputs of a 2×1 multiplexer 502. The select bit of multiplexer 502 is tied to a select line 506, which dictates whether the contents of X1 204 or X0 206 are provided to a first input of a second 2×1 multiplexer 510. The 64 most significant bits of X1 204 and the 64 most significant bits of X0 206 are combined by combiner 504 and provided to the second input of 2×1 multiplexer 510. The select bit of multiplexer 510 is tied to a select line 508, which dictates whether the output of multiplexer 502 or the output of the combiner 504 is provided to the SIMD core 200.

Referring again to FIG. 3, Z register 308 is a special register that has a pixel shift function. This register can receive inputs from X1 memory 204, X0 memory 206, Y memory 208 and the Z register 308 itself. The data of register Z 308 can be stored back to the X or Y memories. The term "Z register" will be used herein to refer to two physical registers Z0 and Z1. In an illustrative embodiment of the present invention, Z0 and Z1 are 256-bit registers. The upper and lower 128 bits of these registers will be referred to as Z0H, Z0L and Z1H, Z1L respectively. Both Z0 and Z1 have the ability to shift left or right by a number of bits corresponding to the number of bits used to represent one pixel. In the illustrative embodiment described herein, a pixel is represented as a 16-bit value. Thus Z0 and Z1 have the ability to shift left or right by one word of 16 bits.

Figure 6:
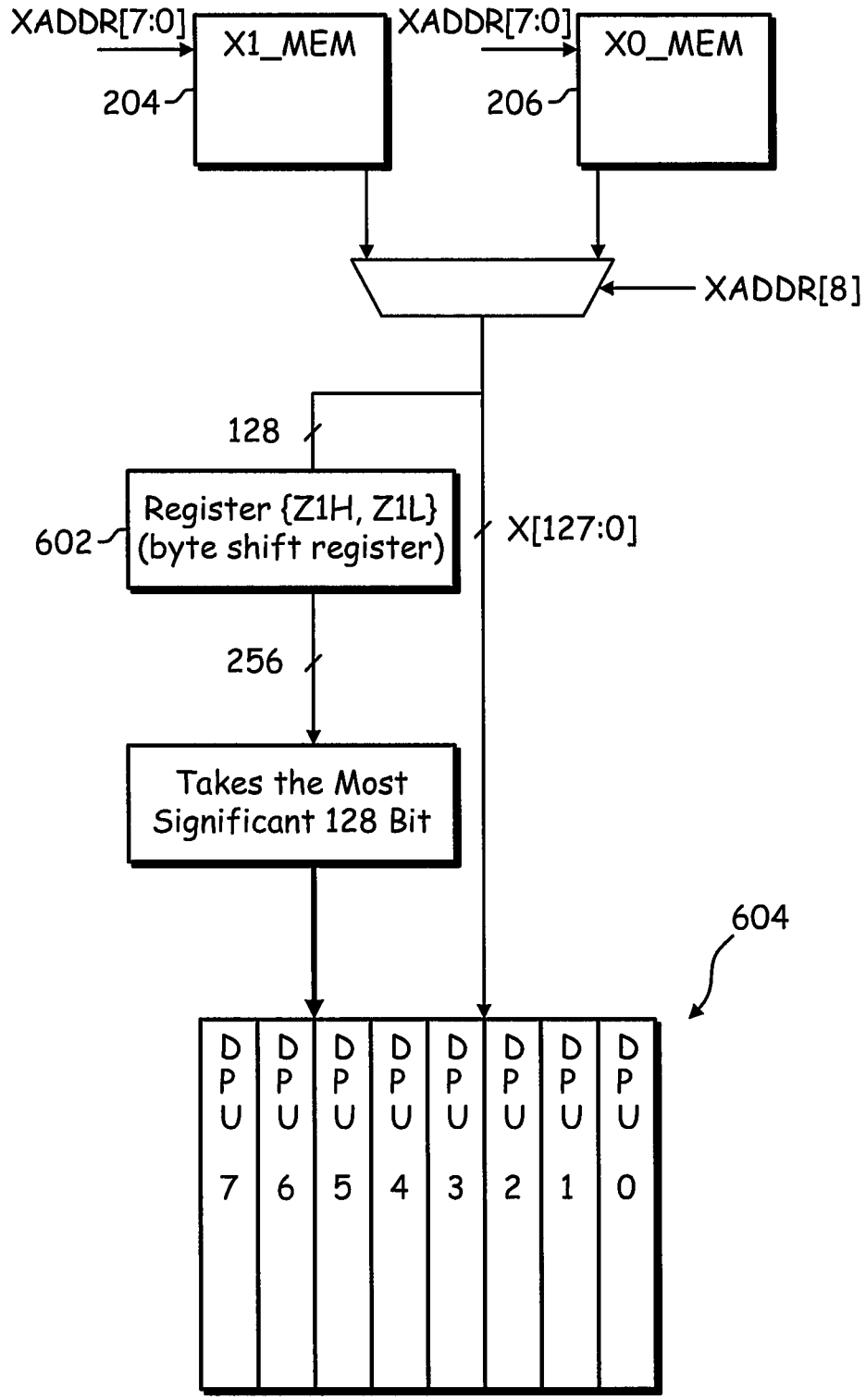
FIG. 6 is a functional block diagram representing the operation of the SIMD processor in the non-split mode according to an illustrative embodiment of the present invention.

FIG. 6 is a functional block diagram representing the operation of the SIMD processor 200 in one embodiment of the non-split mode. In the non-split case, the data path units 604 of the SIMD processor 200 receive all of their operands from the Z1 register 602, and in particular from the 128 most significant bits (Z1H) of Z1 602. The data source for Z1 (Z1H and Z1L register) can be from X1 memory 204 or X0 memory 206. The data source for Z1 can also be or from Y memory 208 or from the Z1 register 602 itself. When the Z1 register is used as the source for the data path units 604 in the non-split mode, only the upper 128 bits of Z1 (Z1[255:128] or Z1H[127:0]) are passed on to the eight data path units 604. While loading the data from Z1 register 602 to itself the data can be shifted by one pixel. Shift capability is illustratively not available during the same clock cycle while loading the data from X memory 204, 206 or Y memory 208. Table 1 describes the operation of the Z register in the non-split case.

TABLE 1

Z Register Operation in the Non-split Case
Z Register Operation in the Non-split Case

| Register Z1H | Register Z1L |
| --- | --- |
| Source XMEM | |
| NS: Z1H = X[127:0] | NS: Z1L = X[127:0] |
| Source Z1 | |
| NS: Z1H = Z1[255:128] | NS: Z1L = Z1[127:0] |
| SL: Z1H = Z1[239:112] | SL: Z1L = {Z1[111:0], 16'd0} |
| SR: Z1H = {Z1[255:240], Z1[255:144]} | SR: Z1L = Z1[143:16] |
| SLS: Z1H = Z1[239:112] | SLS: Z1L = {Z1[111:0], Z1[15:0]} |
| Source YMEM | |
| NS: Z1H = Y[127:0] | NS: Z1L = Y[127:0] |

Figure 7:
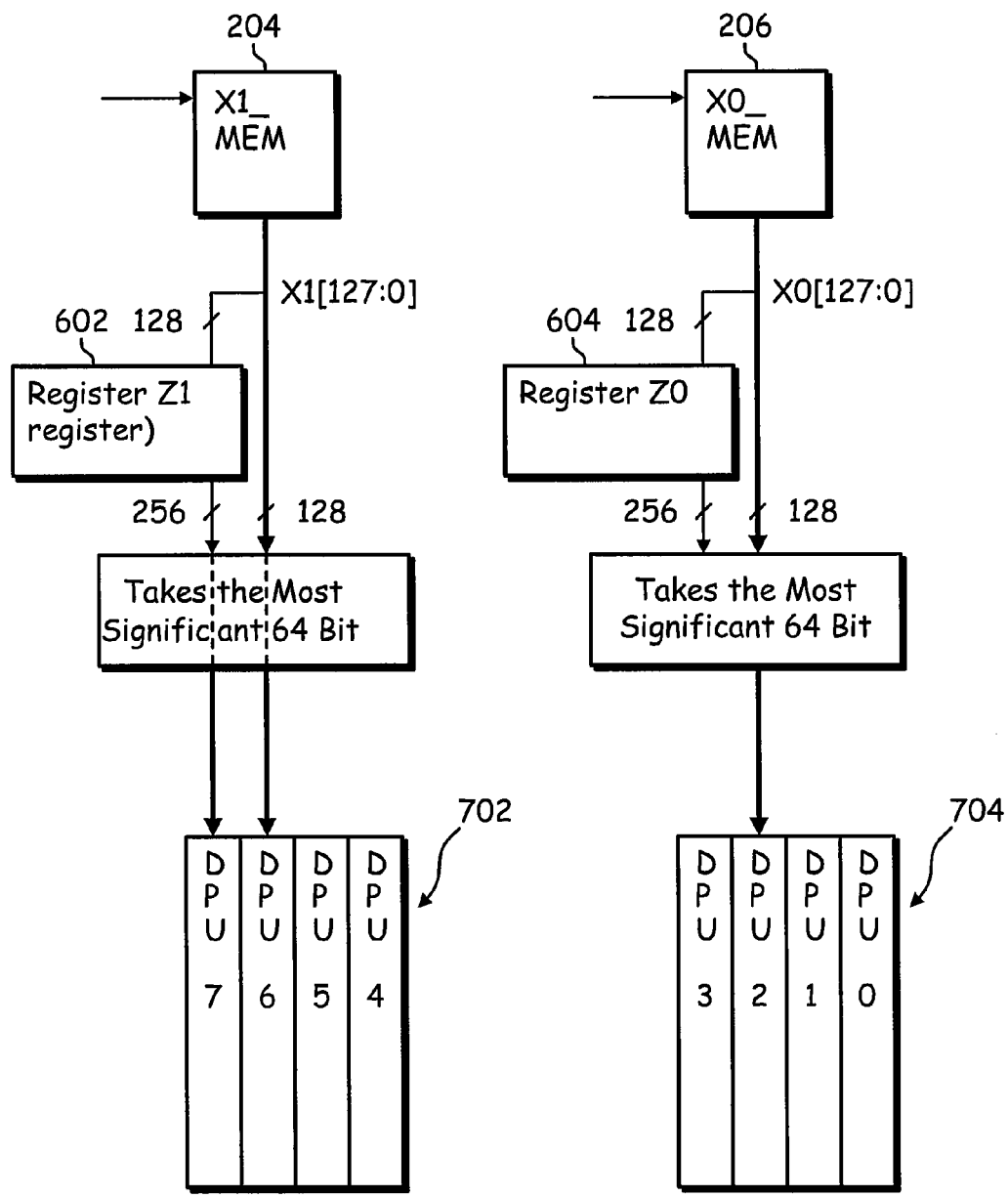
FIG. 7 is a functional block diagram representing the operation of the SIMD processor in the split mode according to an illustrative embodiment of the present invention.

FIG. 7 is a functional block diagram representing the operation of the SIMD processor 200 in the split mode, in accordance with an embodiment of the present invention. In the split case, register Z1 602 and register Z0 604 can both be updated. The data source for Z1 602 (Z1H and Z1L register) can be from X1 memory 204 or from Z1 602 itself. The data source for Z0 604 (Z0H and Z0L register) can be from X0 memory 206 or from Z0 604 itself. Illustratively, Y memory 208 cannot be the data source for the split mode. When the Z register 308 is used as a source in the split mode, the upper 64 bits of Z1 (Z1[255:191] or Z1H[127:64]) are passed on to data path units 4-7 (702) and the upper 64 bits of Z0 (Z0[255:191] or Z0H[127:64]) are passed on to data path units 0-3 (704). While loading the data from Z1 register 602 to itself or from Z0 register 704 to itself the data can be shifted by one pixel. As in the non-split case, shift capability is illustratively not available during the same clock cycle while loading the data from X memory 204, 206.

TABLE 2

Z Register Operation in the Split Case
Z Register Operation in the Split Case

| Register Z1H and Z0H | Register Z1L and Z0L |
| --- | --- |
| Source XMEM | |
| NS: Z1H = X1[127:0], Z0H = X0[127:0] | NS: Z1L = X1[127:0], Z0L = X0[127:0] |
| Source Z1 and Z0 | |
| NS: Z1H = Z1[255:128], Z0H = Z0[255:128] | NS: Z1L = Z1[127:0], Z0L = Z0[127:0] |
| SL: Z1H = Z1[239:112], Z0H = Z0[239:112] | SL: Z1L = {Z1[111:0], 16'd0}, Z0L = {Z0[111:0], 16'd0} |
| SR: Z1H = {Z1[255:240], Z1[255:144]} Z0H = {Z0[255:240], Z0[255:144]} | SR: Z1L = Z1[143:16], Z0L = Z0[143:16] |
| SLS: Z1H = Z1[239:112] | SLS: Z1L = {Z1[111:0], Z1[15:0]} |
| Z0H = Z0[239:112] | Z0L = {Z0[111:0], Z0[15:0]} |

When the Z register is used as a source in the store instruction, only the contents of registers Z1H and Z1L can be written back into the X memory (combined X1 204 and X0 206) and Y memory 208. The store instruction causes all 128 bits of data in Z1H or Z1L to be stored into the indicated memory. The storage instruction does not differentiate between the split and non-split case and only the Z1 (H and L) registers participate in the store instruction.

Figure 8:
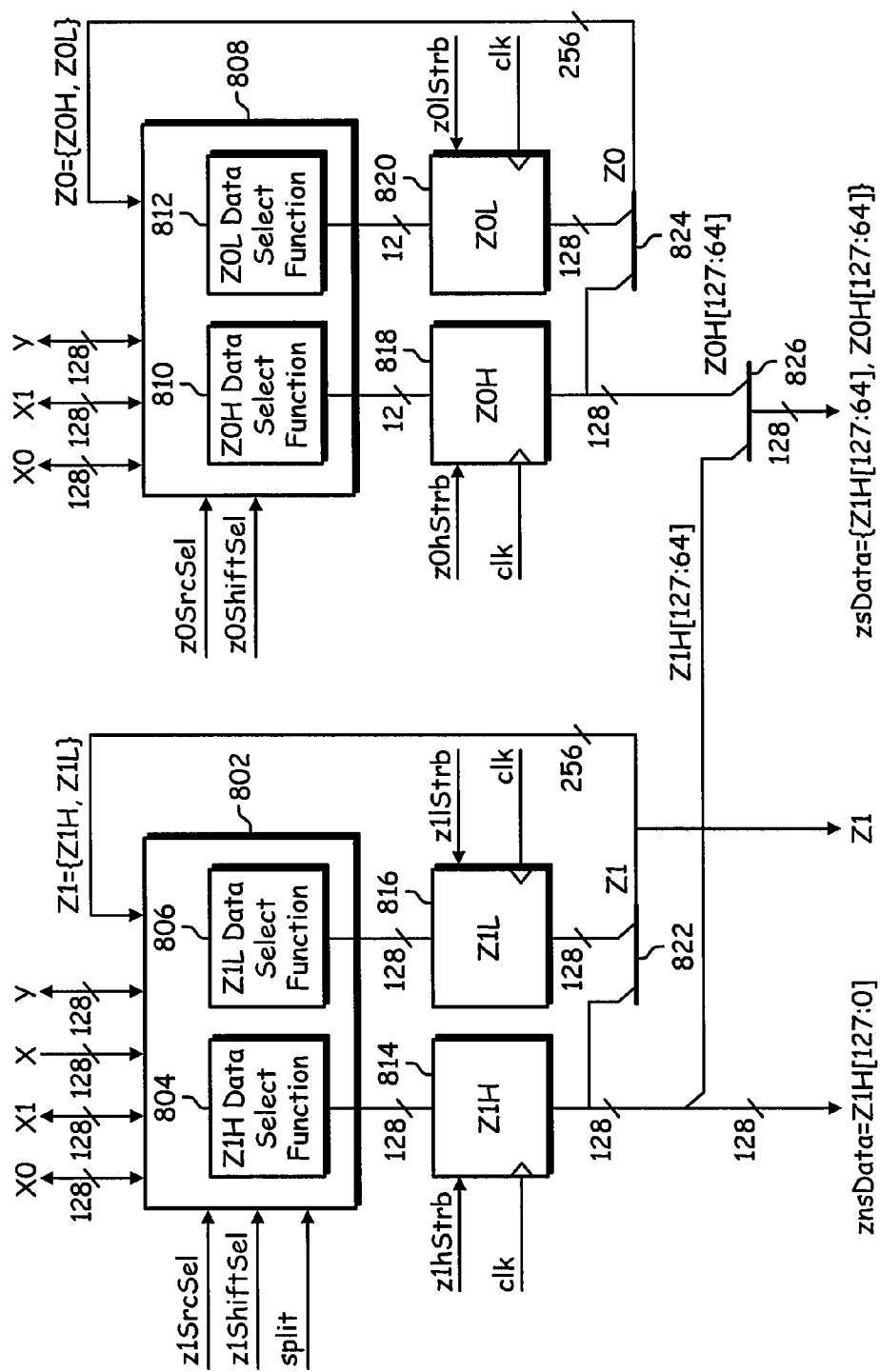
FIG. 8 is a functional block diagram representing the operation of Z registers according to an illustrative embodiment of the present invention.

FIG. 8 is a functional block diagram representing the operation of registers Z1 602 and Z0 604, in accordance with one embodiment of the present invention. FIG. 8 shows Z1 input data select functionality 802, including Z1H data select functionality 804 and Z1L data select functionality 806, and Z0 input data select functionality 808, including Z0H data select functionality 810 and Z0L data select functionality 812. The data select functionality 802, 808 directs the data from the appropriate source, whether it be from X1 memory 204, X0 memory 206, Y memory 208 or from the Z1 register 602 (Z1H 814 and Z1L 816) or Z0 register 604 (Z1H 814 and Z1L 816) themselves, to the Z1 register 602 or Z0 register 604. The data select functionality 802, 808 determines which source is appropriate based upon control signals provided by the SIMD core 200. The data select functionality 802, 808 also shifts the data to be loaded into the Z1 register 602 and Z0 register 604 by 16 bits (1 pixel) if so dictated by the corresponding control signals. Combiner 822 concatenates the contents of Z1H 814 and Z1L 816 to produce a Z1 output. Combiner 824 concatenates the contents of Z0H 818 and Z0L 820 to produce a Z0 output. Combiner 826 concatenates the contents of Z1H 814 and Z0H 818 to produce a combined data set that is provided to the SIMD data path units in the split mode of operation.

Figure 9:
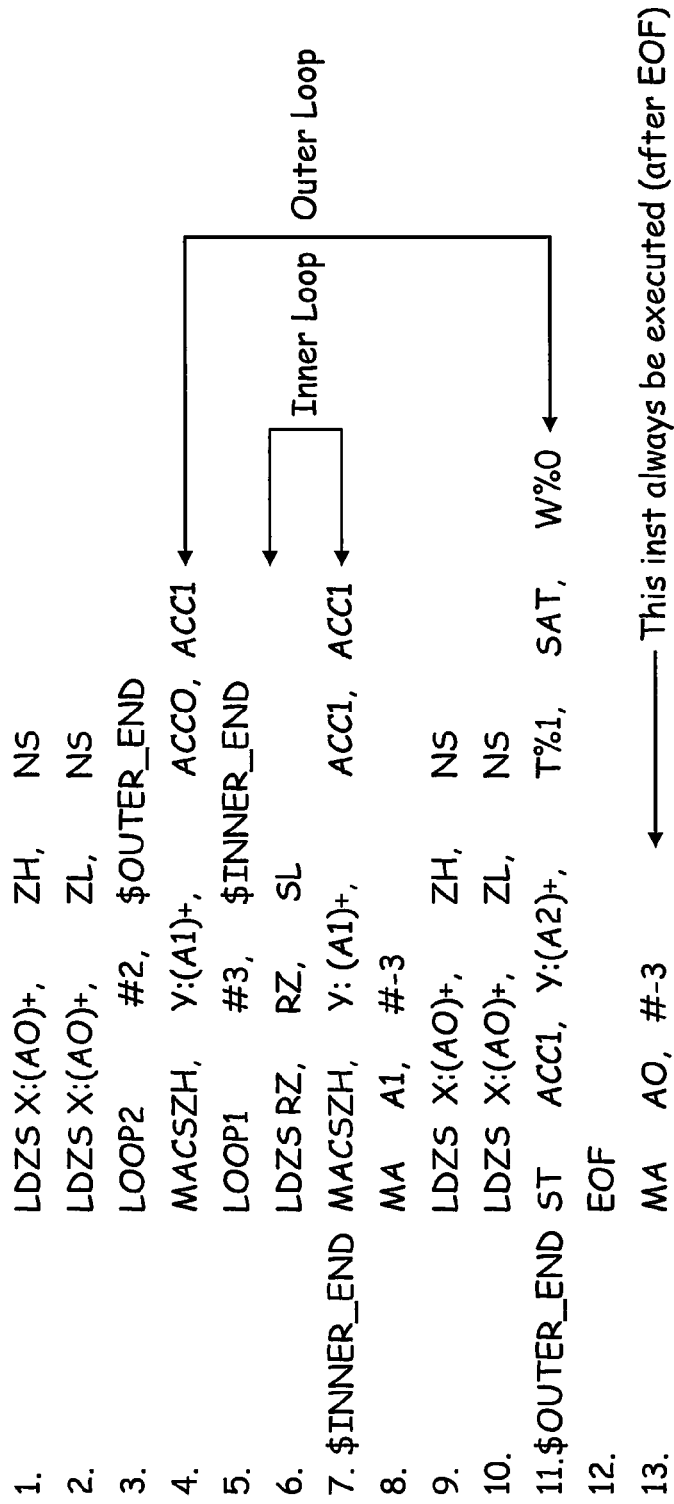
FIG. 9 is a block of assembler code that implements filtering operations on two 4×4 blocks of code simultaneously in the split operation mode according to an illustrative embodiment of the present invention.

FIG. 9 is a block of illustrative assembler code that implements filtering operations on two 4×4 blocks of code (block A and block B) simultaneously in the split operation mode. The illustrative code of FIG. 9 implements 3-tap horizontal filtering. The lines of code in FIG. 9 are numbered sequentially for reference. At line 1, the contents of X1 memory 204 and X0 memory 206 are loaded to the most significant portion (i.e., the 128 most significant bits) of registers Z1 602 and Z0 604 respectively without shifting the contents, and the X memory address pointer is incremented. At line 2, the contents of X1 memory 204 and X0 memory 206 are loaded to the least significant portion (i.e., the 128 least significant bits) of registers Z1 602 and Z0 604 respectively without shifting the contents, and the X memory address pointer is incremented. Line 3, together with line 11, defines an outer program loop that is performed twice. Line 4 is a multiply/accumulate instruction. The four most significant pixels (64 bits) of register Z1 602 and the four most significant pixels of register Z0 604 are multiplied by the filter coefficient, held in the Y memory 208, the results stored in the accumulator 414, and the Y memory address pointer is incremented. Line 5, together with line 7, defines an inner program loop that is performed three times. At line 6, the contents of registers Z1 602 and Z0 604 are shifted to the left one pixel (16 bits), which is achieved by using the Z1 register 602 itself as the source for the load instruction and shifting the contents being loaded 16 bits to the left. At line 7, after left-shifting registers Z1 602 and Z0 604, the four most significant pixels (64 bits) of register Z1 602 and the four most significant pixels of register Z0 604 are again multiplied by the filter coefficient, held in the Y memory 208, the results are stored in the accumulator 414, and the Y memory coefficient address pointer is incremented. After line 7, program control proceeds back to line 6, unless the inner loop has been cycled through three times, in which case program control proceeds to line 8.

At line 8, the Y memory coefficient address pointer is offset by three to point at the first filter coefficient. At line 9, the contents of X1 memory 204 and X0 memory 206 are loaded to the high 128 bits of registers Z1 602 and Z0 604 respectively without shifting the contents, and the X memory address pointer is incremented. At line 10, the contents of X1 memory 204 and X0 memory 206 are loaded to the least significant portion (i.e., the 128 least significant bits) of registers Z1 602 and Z0 604 respectively without shifting the contents, and the X memory address pointer is incremented. At line 11, the contents of one of the accumulator registers 414 are stored in Y memory 208 and a Y memory result address pointer is incremented. After line 11, program control proceeds back to line 4, unless the inner loop has been cycled through twice, in which case program control proceeds to line 12. Line 12 is the end-of-function instruction. At line 13, the X memory address pointer is offset by three to point at the first X memory location holding pixel data.

FIG. 10 is a timing diagram showing the timing of the execution of the illustrative assembler code of FIG. 9. As previously mentioned, in an illustrative embodiment, the SIMD processor 200 employs a five-stage instruction pipeline. The stages are instruction fetching, instruction decoding, operand fetching, execution 1, and execution 2.

The following table lists the data format of X1 memory 204, X0 memory 206 and Y memory 208 in both the split case and the non-split case.

TABLE 3

Data format of XMEM and Register Z in both split case and non-split case.

| | Non-Split Case | | | Split Case | | |
|---|---|---|---|---|---|---|
| | X | Y | ZH | X | Y | ZH |
| DPU7 | X[127:112] | Y[127:112] | Z1H[127:112] | X1[127:112] | Y[127:112] | Z1H[127:112] |
| DPU6 | X[111:96] | Y[111:96] | Z1H[111:96] | X1[111:96] | Y[111:96] | Z1H[111:96] |
| DPU5 | X[95:80] | Y[95:80] | Z1H[95:80] | X1[95:80] | Y[95:80] | Z1H[95:80] |
| DPU4 | X[79:64] | Y[79:64] | Z1H[79:64] | X1[79:64] | Y[79:64] | Z1H[79:64] |
| DPU3 | X[63:48] | Y[63:48] | Z1H[63:48] | X0[127:112] | Y[63:48] | Z0H[127:112] |
| DPU2 | X[47:32] | Y[47:32] | Z1H[47:32] | X0[111:96] | Y[47:32] | Z0H[111:96] |
| DPU1 | X[31:16] | Y[31:16] | Z1H[31:16] | X0[95:80] | Y[31:16] | Z0H[95:80] |
| DPU0 | X[15:0] | Y[15:0] | Z1H[15:0] | X0[79:64] | Y[15:0] | Z0H[79:64] |

Although certain exemplary embodiments of the present invention have been described, it should not be construed to limit the scope of the appended claims. For example, the present invention can be implemented by either a software embodiment or a hardware embodiment. Those skilled in the art will understand that various modifications may be made to the described embodiment. Moreover, to those skilled in the various arts, the invention itself herein will suggest solutions to other tasks and adaptations for other applications. It is therefore desired that the present embodiments be considered in all respects as illustrative and not restrictive. It is therefore intended that the following claims be interpreted as covering all such alterations and modifications as fall within the true spirit and scope of the invention.

The invention claimed is:

1. A media processing filter engine operable to perform filtering operations on an input data stream comprising blocks of media data, the filter engine comprising:
   a first memory unit operable to store blocks of media data and to output a first block of media data to be processed;
   a second memory unit operable to store blocks of media data and to output a second block of media data to be processed;
   a first multiplexer coupled to the output of the first memory unit and to the output of the second memory unit and operable to output a selected one of the first block of media data and the second block of media data;
   a combiner coupled to the output of the first memory unit and to the output of the second memory unit and operable to output a combined block of media data corresponding to a portion of the first block of media data and a portion of the second block of media data;
   a second multiplexer coupled to the output of the first multiplexer and the output of the combiner and operable to output a selected one of the combined block of media data and the selected one of the first block of media data and the second block of media data; and
   a single instruction, multiple data (SIMD) processor operable to receive blocks of media data from the second multiplexer and to perform filtering operations on blocks of media data from the first and second memory units concurrently.

2. The filter engine of claim 1 wherein the SIMD processor is adapted to receive the selected one of the first block of media data and the second block of media data from the second multiplexer when the filter engine is in a split-operation mode, and wherein when the filter engine is in a non-split-operation mode, the SIMD processor is adapted to receive the combined block of media data from the second multiplexer.

3. The filter engine of claim 1 wherein the SIMD processor comprises a plurality of data path units comprising a first set of data path units and a second set of data path units, and when the filter engine is in a split-operation mode, the first set of data path units is adapted to perform filtering operations on the first block of media data received from the first memory unit while the second set of data path units is concurrently performing filtering operations on the second block of media data received from the second memory unit.

4. The filter engine of claim 1 wherein the SIMD processor comprises a plurality of data path units comprising a first set of data path units and a second set of data path units, and when the filter engine is in a non-split operation mode, both the first and second sets of data path units perform filter operations on the combined block of media data.

5. The filter engine of claim 1 adapted to perform filtering operations on an input data stream comprising blocks of video data, wherein:
   the first memory unit is adapted to store blocks of pixel data to be processed;
   the second memory unit is adapted to store blocks of pixel data to be processed; and
   the SIMD processor is adapted to receive blocks of pixel data from the first and second memory units and to perform filtering operations on blocks of pixel data from the first and second memory units concurrently.

6. The filter engine of claim 1, wherein the portion of the first block of media data includes the m most significant bits of the first block of media data, and the portion of the second block of media data includes the n most significant bits of the second block of media data.

7. The filter engine of claim 6, wherein t is the total number of bits in each of the first block of media data and the second block of media data, and m and n equal t divided by 2.

8. A media processing filter engine adapted to perform filtering operations on an input data stream comprising blocks of video data, the filter engine comprising:
   a first memory unit operable to store blocks of video data and to output a first block of video data to be processed;
   a second memory unit operable to store blocks of video data and to output a second block of video data to be processed;
   a combiner coupled to the output of the first memory unit and to the output of the second memory unit and operable to output a combined block of video data corresponding to a portion of the first block of video data and a portion of the second block of video data;
   a multiplexer operable to select one of the first block of video data and the combined block of video data;
   a first shift register operable to receive and store the selected one of the first block of video data and the combined block of video data;
   a second shift register operable to receive and store the second block of video data; and
   a processor operable to receive blocks of video data from the first and second shift registers and to perform filtering operations on blocks of video data from the first and second shift registers concurrently.

9. The filter engine of claim 8, wherein the first and second shift registers are configured to selectively shift their contents by a predetermined number of bits corresponding to the size of one pixel.

10. The filter engine of claim 8 wherein the processor is adapted to receive blocks of data from the first and second shift registers, and to concurrently perform filtering operations on blocks of video data from the first and second shift registers, when the filter engine is in a split-operation mode, and wherein when the filter engine is in a non-split-operation mode, the first shift register is adapted to receive and store blocks of video data from the first and second memory units, and the processor is adapted to receive blocks of video data from the first shift register, but not from the second shift register, and to perform filtering operations on blocks of video data from the first shift register.

11. The filter engine of claim 10 wherein when the filter engine is in the split-operation mode, the m most significant bits of the first shift register and the n most significant bits of the second shift register are provided to the processor, and the processor concurrently performs filtering operations on the m most significant bits of the first shift register and the n most significant bits of the second shift register.

12. The filter engine of claim 11 wherein m and n are both equal to t/2, where t is the total number of bits on which the processor is capable of concurrently performing filtering operations.

13. The filter engine of claim 8 wherein the processor comprises a plurality of data path units comprising a first set of data path units and a second set of data path units, and wherein the first set of data path units is adapted to perform filtering operations on a block of video data received from the first shift register while the second set of data path units is concurrently performing filtering operations on a block of video data received from the second shift register.

14. The filter engine of claim 13 wherein, when the filter engine is in a split-operation mode, the first set of data path units performs filtering operations on the block of video data received from the first shift register while the second set of data path units concurrently performs filtering operations on the block of video data received from the second shift register, and wherein when the filter engine is in a non-split-operation mode, the first shift register is adapted to receive and store blocks of video data from the first and second memory units, and both the first and second sets of data path units perform filter operations on blocks of video data from the first shift register, but not from the second shift register.

15. The filter engine of claim 14 wherein when the filter engine is in the split-operation mode, the m most significant bits of the first shift register are provided to the first set of data path units and the n most significant bits of the second shift register are provided to the second set of data path units, and the first set of data path units performs filtering operations on the m most significant bits of the first shift register while the second set of data path units concurrently performs filtering operations on then most significant bits of the second shift register.

16. The filter engine of claim 15 wherein m and n are both equal to t/2, where t is the total number of bits on which the plurality of data path units are capable of concurrently performing filtering operations.

17. A system, comprising:
a first data storage means configured to output a first block of data;
a second data storage means configured to output a second block of data;
means for outputting a selected one of the first block of data and the second block of data;
means for outputting a combined block of data corresponding to a portion of the first block of data and a portion of the second block of data;
means for outputting a selected one of the combined block of data and the selected one of the first block of data and the second block of data; and
means for performing filtering operations on blocks of data from the first and second data storage means concurrently.

18. The system of claim 17, wherein the means for performing filtering operations is configured to receive the selected one of the first block of data and the second block of data when the system is in a split-operation mode, and wherein when the system is in a non-split-operation mode, the means for performing filtering operations is configured to receive the combined block of data.

19. The system of claim 17, wherein the means for performing filtering operations comprises a plurality of data path units comprising a first set of data path units and a second set of data path units, and when the system is in a split-operation mode, the first set of data path units is configured to perform filtering operations on the first block of data while the second set of data path units is concurrently performing filtering operations on the second block of data.

20. The system of claim 17, wherein the means for performing filtering operations comprises a plurality of data path units comprising a first set of data path units and a second set of data path units, and when the system is in a non-split operation mode, both the first and second sets of data path units are configured to perform filter operations on the combined block of data.

21. The system of claim 17, wherein the first block of data and the second block of data correspond to pixel data.

22. The system of claim 17, wherein the means for performing filtering operations comprises a plurality of data path units comprising a first set of data path units and a second set of data path units,
wherein when the system is in a split-operation mode, the first set of data path units performs filtering operations on a block of data received from a first shift register while the second set of data path units concurrently performs filtering operations on a block of data received from a second shift register, and
wherein when the system is in a non-split-operation mode, the first shift register is adapted to receive and store blocks of data from the first data storage means and the second data storage means, and both the first and second sets of data path units perform filter operations on blocks of data from the first shift register, but not from the second shift register.

* * * * *